United States Patent [19]
Stelzle et al.

[11] Patent Number: 5,939,150
[45] Date of Patent: Aug. 17, 1999

[54] METHOD FOR TREATING A SUBSTRATE SURFACE

[75] Inventors: Martin Stelzle, Reutlingen, Germany; Pascal Doppelt, Paris, France

[73] Assignees: Max-Planck-Gesellschaft Zur Forderung Der Wissenschaften E.V., Germany; CNRS-Service De La Valorisation, France

[21] Appl. No.: 08/846,107

[22] Filed: Apr. 25, 1997

[30] Foreign Application Priority Data

Apr. 26, 1996 [EP] European Pat. Off. .............. 96106673

[51] Int. Cl.⁶ .................................................. B05D 3/06
[52] U.S. Cl. ........................... 427/558; 427/261; 427/331; 427/404; 427/407.1; 427/496; 427/497; 427/500; 427/509; 427/510; 427/514; 427/525; 427/526; 427/535; 427/550; 427/569
[58] Field of Search ...................................... 427/496, 497, 427/500, 509, 510, 514, 525, 526, 535, 569, 261, 331, 404, 407.1, 550, 558

[56] References Cited

FOREIGN PATENT DOCUMENTS 0577187  5/1994  European Pat. Off. .

OTHER PUBLICATIONS

Materials Research Society Symposium Proceedings, vol. 380, Apr. 19, 1995, pp. 23–34, XP000600865 E.A. Dobsiz et al: "Self–Assembled Monolayer Films for Nanofabrication" * p. 26, paragraph 3—p. 30 *.

Journal of the Electrochemical Society, vol. 139, No. 6, Jun. 1, 1992, pp. 1677–1680, XP000324420 Calvert J.M. et al.: "Deep Ultraviolet Lithography of Monolayer Films With Selective Electroless Metallization" * p. 1677, paragraph 5—p. 1678 *.

Langmuir, vol. 11, No. 6, Jun. 1 1995, pp. 1841–1845, XP000571890 Potochnik S.J. et al.: "Selective Copper Chemical Vapor Deposition Using PD–Activated Organosilane Films" *p. 1841–p. 1842 *.

Patent Abstracts of Japan, vol. 011, No. 024 (C–399), Jan. 23, 1987 & 1987 & JP–A–61 190071 (Hitachi Chem Co Ltd), Sep. 3, 1986 * abstract *.

Journal of the American Chemical Society, vol. 115, No. 26, Dec. 29, 1993, pp. 12631/12632 XP000571415 Linford M.R. et al.: "Alkyl Monolayers Covalently Bonded To Silicon Surfaces".

*Primary Examiner*—Bernard Pianalto
*Attorney, Agent, or Firm*—Ostrolenk, Faber, Gerb & Soffen, LLP

[57] ABSTRACT

The present invention relates to a method for treating a substrate surface. The substrate surface is coated with a thin film of a treating agent, which is capable of enhancing or reducing its affinity towards a metal precursor by exposure to an arbitrary kind of radiation beam. In a subsequent metal deposition step utilizing the metal precursor, the metal is selectively deposited on the exposed or unexposed areas, depending on the kind of treating agent. (FIG. 1)

28 Claims, 2 Drawing Sheets

METHOD FOR TREATING A SUBSTRATE SURFACE

The present invention relates to a method for treating a substrate surface, a substrate surface which is treated by this method, and to the use of such a substrate surface for the manufacture of semiconductor devices or printed circuits having conductive pathways. Moreover, the present invention relates to a method for producing an at least partially metallized surface.

In particular in semiconductor device technology, it is desired to obtain predetermined metallization patterns such as conductive pathways etc. having well defined dimensions. A conventional process for producing such metallization patterns involves the coating of a substrate surface with a photoresist, patterning the photoresist by exposing the surface to such as UV-/vis-radiation, electron beam or ion beam radiation, subsequently developing the photoresist so as to obtain a photoresist pattern, depositing a metal layer by, for example, a CVD process and then removing the photoresist pattern as well as the metal layer which is deposited on the photoresist pattern by means of a lift-off process.

Accordingly, by these steps it has been possible to selectively deposit a metal. However, the exposure step using electron beam or ion beam radiation results in radiation damages of the semiconductor material. Furthermore, the developers and organic solvents used for developing the exposed photoresist layer and the lift-off process, respectively, degrade and contaminate the substrate surface. Moreover, the problem of environmental pollution is caused. An additional problem is due to the fact that the minimum photoresist layer thickness which can be obtained is about 20 nm and that the photoresist layer usually does not have always a uniform thickness. Accordingly, it has been difficult to define conductive pathways having a quite narrow and sharp linewidth, since problems with depth of focus and underetching of the developer as well as scattering of the radiation will cause an enlargement of the prescribed structures, which additionally will become out of focus.

Furthermore, when downsizing the device structures, the electrical conductivity of the metals used for metallization is becoming an important parameter. Owing to its low resistivity and high electromigration resistance, copper is predicted to become the interconnect material for semiconductor device technology at dimensions 0.25 μm or below. However, because of its poor adhesion on Si and SiO$_2$ surfaces and diffusion problems, an intermediate layer, such as TiN, is usually required for the deposition of copper films.

As completely dry metal deposition methods, chemical vapor deposition (CVD) processes are increasingly important for the deposition of thin metal films and for filling of high-aspect ratio vias in VLSI multi-level interconnect schemes. As a possible reaction mechanism, the deposition of pure copper films, for example, can be achieved by CVD from Lewis-base (L) stabilized copper(I) β-diketonate complexes; it results from a thermally induced disproportionation reaction, shown in Eq. 1:

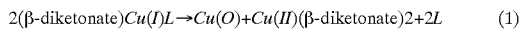

$$2(\beta\text{-diketonate})Cu(I)L \rightarrow Cu(O)+Cu(II)(\beta\text{-diketonate})2+2L \quad (1)$$

An overview of selective chemical vapour deposition of metals from metal-containing compounds is given in the article by Mark J. Hampden-Smith and Toivo T. Kodas in Chem. Vap. Deposition 1995, 1, No. 2 entitled "Chemical Vapour Deposition of Metals: Part 2 Overview of Selective CVD of Metals".

The document WO 95/21030 discloses a method for selectively depositing copper wherein benzyl halide or benzyl pseudohalide groups are attached to a substrate surface by treatment with an organosilane reagent having the benzyl halide or benzyl pseudohalide moieties. The thus treated substrates are exposed to radiation so that the ability of the benzyl (pseudo)halide moieties to react with an amino group terminated nucleophilic reagent is reduced at the exposed areas, the substrates are contacted with the amino groups on the unexposed areas (negative image), and subsequently an electroless plating metallization catalyst like Pd is applied. The catalyst only bonds to the amino group terminating areas of the substrate surface. Finally, a copper film is deposited on those areas where the catalyst is present, by means of a wet process. By attaching diazonaphthoquinone groups instead of benzyl (pseudo)halides to the substrate, and subsequently performing the same steps as mentioned above, it is possible to selectively deposit copper at the exposed areas (positive image). However, the method disclosed in this document has various drawbacks. In particular, it is necessary to apply a catalyst in a wet step. Moreover, copper is deposited from a plating bath, thus involving a further wet step. These wet processing steps make the whole method expensive and time-consuming and, in addition, largely degrade the surface.

The method suggested in the article "Selective Copper Chemical Vapor Deposition Using Pd-Activated Organosilane Films" by Stephen J. Potochnik et al., Langmuir, Vol. 11, No. 6, 1995, reduces the number of wet processing steps and, furthermore, uses a CVD process for depositing copper. The method comprises the steps of applying amino-functional self-assembled silane films on oxidized substrates and attaching a $PdCl_4^{2-}$ based catalyst to the ligating amino-functional silane film from an aqueous solution. The $PdCl_4^{2-}$ catalyst catalyzes the Cu deposition in a subsequent CVD process. By irradiating radiation on the amino-functional silane film the amino-functional moieties that are necessary for catalyst attachment are cleaved from the surface so that a selective metallization by patterned irradiation becomes possible.

However, this process as well requires the presence of a catalyst which has to be applied in an additional wet processing step. Moreover, only negative images could be produced by irradiation.

Accordingly, it is an object of the present invention to provide a method which solves the above mentioned drawbacks of the state of the art.

In particular, it is an object of the present invention to provide a simple method of treating a substrate surface so that in a subsequent metallization step a metal is selectively deposited.

Additionally, it is an object of the present invention to provide a method for producing an at least partially metallized surface which solves the above mentioned problems.

Moreover, it is an object of the present invention to provide a substrate having a thus treated substrate surface.

According to the present invention, the above objects are achieved by a method for treating a substrate surface comprising the steps of providing a substrate and applying a thin film comprising a treating agent, said treating agent reducing its affinity towards a precursor of a metal to be deposited upon exposure to a radiation beam.

Alternatively, according to the present invention, the above objects are achieved by a method for treating a substrate surface comprising the steps of providing a substrate and applying a thin film comprising a treating agent, said treating agent enhancing its affinity towards a precursor of a metal to be deposited upon exposure to a radiation beam.

Since in a subsequent metallization step the metal precursor directly reacts with the thus treated substrate surface, it is not necessary to apply a catalyst by means of a wet process as in the prior art. Furthermore, the metal can be deposited by means of a CVD process so that all steps can be performed in a dry process. Since the affinity towards a metal precursor can be changed (i.e. reduced or enhanced) by means of exposure to a radiation beam, it is possible to selectively deposit a metal in a subsequent metallization step.

The present invention also provides a method for producing an at least partially metallized surface which comprises the above method of treating a substrate surface and a step of depositing a metal.

In addition, the present invention provides a treated substrate which is prepared by a method as defined above. Moreover, this treated substrate can be used for the manufacture of semiconductor devices or printed circuits having conductive pathways.

In the following, the principle of the present invention will be described for the deposition of a metal film on a substrate with reference to FIG. 1, wherein the deposition of Cu is illustrated.

Figure 1A:
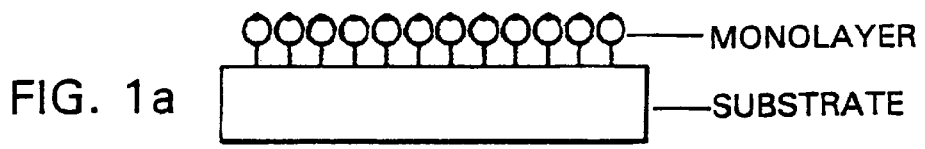
FIG. 1 schematically illustrates the principle of the present invention.

As shown in FIG. 1a), a thin film, preferably a monolayer, of a treating agent is applied onto a substrate surface. The treating agent preferably provides a covalent bond to the substrate so that the thin film withstands high temperatures and a low pressure with are applied during a CVD process. Moreover, the treating agent is activated or passivated upon irradiation with a radiation beam and—in its irradiated or non-irradiated form—directly reacts with a metal precursor of a metal to be deposited.

The treating agent can be represented by the general formula:

X—L—Y wherein X is at least one functional group for bonding to the substrate, L is a linker group, and Y is at least one functional group enabling the treating agent in its irradiated or non-irradiated form to directly react with the metal precursor.

The linker group is selected depending on the substrate so as to enable a covalent bond of the applied linker group. In the case of using an oxide substrate such as a $SiO_2$ substrate, it is preferred that the linker group in its applied form is a silane compound so that the covalent bonds to the substrate can be achieved by means of siloxane bonds.

In this case, the treating agent preferably is represented by the general formula $X_k R^1{}_n Si(R^2 Y)_m$, wherein $R^1$ and $R^2$, respectively, represent a substituted or unsubstituted, branched or straight chain alkyl group, a substituted or unsubstituted aryl group or a substituted or unsubstituted aralkyl group, k denotes an integer number of 1 to 3, m denotes an integer number of 1 to 3 and n=4−m−k with n≧0. Alternatively, Si may be replaced by Ge or Sn.

The number of carbon atoms of $R^1$ and $R^2$, respectively, is not particularly limited. Nevertheless, in view of better linking properties, it is preferred that each of the groups $R^1$ and $R^2$ does not have a number of carbon atoms exceeding 18.

In the above formula, $R^1$ and/or $R^2$ may be fluorinated. The presence of fluorine in $R^1$ and/or $R^2$ may modify the wettability or adhesion properties of the layer.

In case of using a metal substrate such as a gold substrate or a semiconductor substrate such as a silicon substrate, it is preferred that the linker group in its applied form is an alkyl compound.

Moreover, X is selected so as to ensure a covalent bond of the linker group to the substrate. Hence, X as well as the linker group L preferably are selected depending on the substrate. If the substrate is made of an oxide such as $SiO_2$, examples of X comprise halogen atoms, particularly Cl, Br, and J, methoxy or ethoxy groups. If the substrate is made of a semiconductor such as silicon, X preferably is a peroxide group. For example, the method described by Matthew R. Linford and Christopher E. D. Chidsey in "Alkyl Monolayers Covalently Bonded to Silicon Surfaces" in J. Am. Chem. Soc. 1993, 115, pp. 12631 to 12632, can be used for providing linker group (alkyl) monolayers which are covalently bonded to Si(111) and Si(100) surfaces via peroxide functional groups. Alternatively, unsaturated hydrocarbons can be attached to the substrate surface in the presence of a catalyst such as $H_2PtCl_6$. For example, the following reaction can take place:

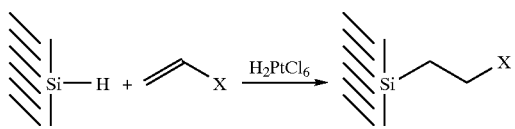

In the case of using a metal substrate such as gold or other nobel metals, thiols or disulfides may be used as functional groups X for providing linker group (alkyl) monolayers on the substrates.

In addition, the functional group Y is selected so that the affinity of the treating agent towards a metal precursor is changed upon irradiation with a radiation beam. In particular, the functional group Y—in its irradiated or non-irradiated form—directly and immediately reacts with the metal precursor. Accordingly, the functional group Y has to be selected depending on the metal precursor employed in a subsequent metallization step. In this respect, previous attempts have aimed at enhancing the affinity of the treating agent towards the metal atom of the precursor. Accordingly, conventionally amino groups have been preferably used for enhancing the affinity towards the metal atom of the precursor.

However, as the present inventors surprisingly found out, the selectivity can be in particular be improved by maximizing the affinity towards the ligands of the metal precursor. Accordingly, it is preferred to select the suitable metal precursor as well as the suitable functional group Y so that the best affinity of the treating agent towards the ligand of the metal precursor is obtained.

The affinity of the treating agent towards metal complexes is enhanced or reduced by exposing the surface to a radiation beam. This can be achieved by a rearrangement, transformation, damage, removal, or otherwise change of the internal structure of the functional group Y which selectively reacts with the ligand of the metal precursor upon exposure with a radiation beam.

Examples of the functional group Y which fulfill the above requirements comprise the following: halogen atoms, tosylate, CR=CR'$_2$, —C≡C—R, —SnR$_3$, OSiR$_3$, N$_3$, OSO$_2$CR$_3$, —OSO$_2$Ar, —OCN, —CN, —NC, and —SH, wherein R and R', respectively, represent a substituted or unsubstituted, branched or straight chain alkyl group, a substituted or unsubstituted aryl group or a substituted or unsubstituted aralkyl group. Of course, other functional groups Y which fulfill the above conditions can be employed.

Among these examples, the —SH group is activated upon irradiation with the radiation beam, whereas the other examples are passivated upon irradiation with the radiation beam.

Accordingly, depending on the kind of desired image, preferred treating agents for treating a SiO$_2$ surface for the subsequent deposition of copper include the following: 1-(dimethylchlorosilyl)-2-(p,m-chloromethylphenyl) ethane (DMCSE), Trivinylchlorosilane (TVCS), 3-bromopropyltrichlorosilane (BPTCS), 3-iodopropyltrichlorosilane as a silylating agent having an enhanced affinity to a metal-precursor after the silylation procedure and a reduced affinity to a metal-precursor after exposure to a radiation beam (negative image). Moreover, 3-Mercaptopropyltrimethoxysilane (MPTMS) and Mercaptopropyltriethoxysilane (MPTES), as silylating agents having a reduced affinity to metal-precursors after the silylation procedure and an enhanced affinity to metal precursors after exposure to a radiation beam (positive image).

It is further preferred that the functional group Y and the functional group X which covalently bonds to the substrate surface are compatible to each other.

The treating agent can be applied by CVD as well as by other methods such as a wet chemical step utilizing an organic solvent or the like. However, the method of applying the treating agent must be chosen so as to ensure the formation of a covalent bond between the substrate surface and the treating agent.

In the case of using a treating agent having an enhanced affinity towards metal precursors after exposure to a radiation beam, prior to the deposition of the metal, it will be necessary to expose those areas of the surface where the metal is to be deposited, to a radiation beam.

Figure 1B:
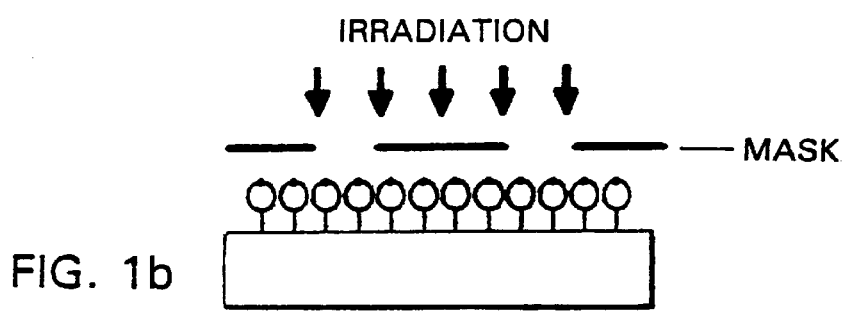
Figure 1C:
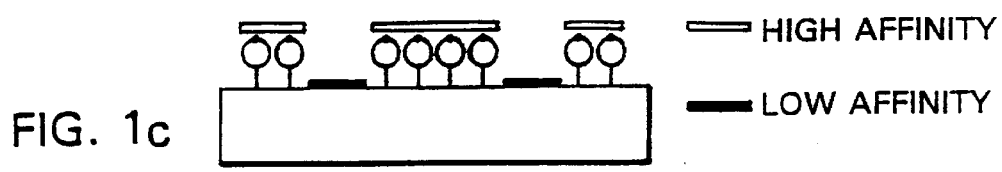
Figure 1D:
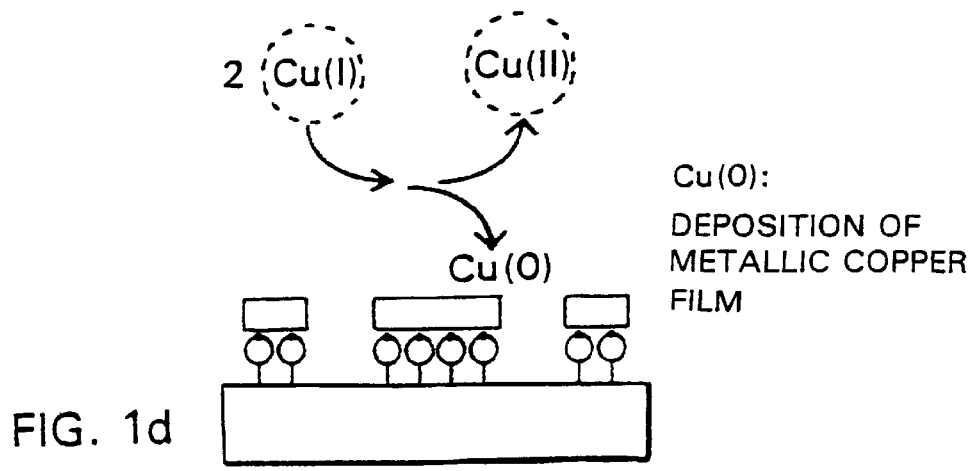

On these derivatized and optionally exposed substrate surfaces, as shown in FIGS. 1b) and 1c), a step of at least partially depositing a metal layer is performed using a metal precursor. The step of depositing a metal layer which is illustrated in FIG. 1d), is preferably performed by a CVD process. The step of depositing a metal layer is in particular performed utilizing the disproportionation reaction as mentioned above. In this case, the metal to be deposited can be provided by any metal "complex" or "precursor" which underlies the disproportionation reaction according to formula (1). The step of depositing a metal layer can also take place even when the disproportionation reaction cannot take place. Then the bound metal complex can be reduced by a reactive gas as H$_2$ or SiH$_4$ leating to the formation of the nucleation metallic layer that can induce further metal deposition. Examples for the metal to be deposited include: Ni, Ti, Co, Ru, Ag, Au, and Pd.

The metal precursor used in the metallization step preferably comprises a ligand which is especially selected so as to enable a bond to the functional group Y of the treating agent in its irradiated or non-irradiated form.

Examples of the metal precursor comprise (β-diketonate) MeL and (diketoimine)MeL complex as well as Me(diketonate)$_n$ complexes, wherein n denotes an integer number of 1 to 4. Me is the metal to be deposited as mentioned above, in an appropriate oxidation state for the disproportionation reaction, e.g. Cu(I), L denotes a Lewis base such as vinyltrimethylsilane (vtms), 3-hexyne or (dimethyl)1,5-cyclooctadiene (DMCOD), for example. It was shown that the best selectivity was achieved when using DMCOD as the Lewis base. The β-diketonate preferably is hexafluoroacetylacetonate (hfac).

The present invention is in particular advantageous over the prior art methods that no catalyst is necessary for depositing the metal on the treated surface. This advantageous feature will be explained in the following, taking the deposition of copper on a SiO$_2$ surface as a special example. It has been observed that the functional group —CH$_2$Cl has stimulated the deposition of copper by CVD. In particular, it has been shown that a Cu CVD process conducted under the same conditions on an equivalent surface having a —CH$_3$ group instead of —CH$_2$Cl will result in a non-uniformly deposited Cu film having a very low thickness. In addition, it has been shown that a —CH$_2$Br group even provides better results than a —CH$_2$Cl group. It is assumed that the following reaction takes place.

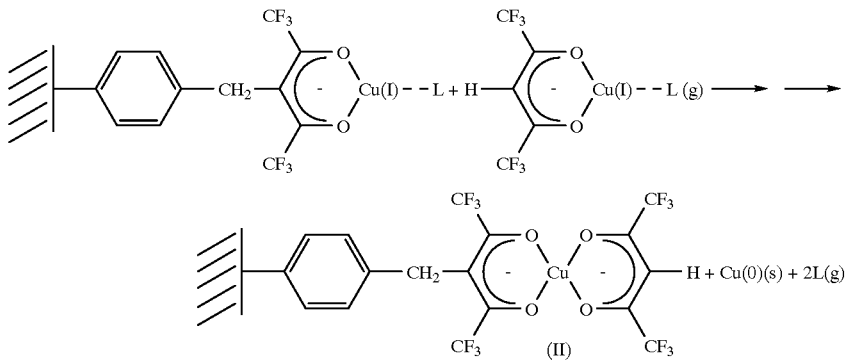

In particular, it is assumed that the functional group —CH$_2$Cl reacts with the ligand hfac which is bonded to a Cu(I)-atom. In a subsequent reaction step the Cu(I)-atom disproportionates to give metallic Cu and Cu(II) complex. The substrate surface with the attached ligands hfac that are bonded to the Cu(II) contains metallic copper that serves as a nucleation layer and, thus, enables the deposition of Cu. This propoed mechanism is inspired by the one give by the action of alkyl bromide on Cu(II) or Co(II) β-diketonate in non-polar solvents (J. Cervello et al., Tetrahedron 46(6), 1990, p. 2035, M. E. Lloris et al., Tetrahedron 47(37), 1991, p. 8031). It is a radicalar mechanism that can be transposed in the case of activated surfaces. As a consequence, any group leading to radicalar reaction can be chosen as an activated group toward Cu CVD.

Moreover, if the treating agent is applied by a CVD process and the metallization step is performed by a CVD process, the same reactor may be used for performing the step of applying the treating agent as well as the step for depositing the metal layer. Accordingly, time and cost can be further saved and the whole metallization process can be further simplified.

For irradiation, known patterning and exposing methods which are known in semiconductor technology can be used. Preferred radiation sources comprise photon, electron and ion sources. Examples of methods for patterning the treated substrate surface include UV exposure systems, vis exposure systems, lasers, X-ray exposure systems, electron beam exposure systems comprising scanning electron microscopes and scanning tunneling microscopes and focused ion beam exposure systems.

Moreover, since it is possible to uniformly apply thin films or monolayers of the treating agent on the substrate surfaces, it is in particular possible to define very narrow line widths without any of the disadvantageous effects which are commonly encountered in photoresist techniques.

In addition, in order to further enhance the selectivity of the metal deposition step, it is preferable to perform, prior to the metal deposition, a further step of passivating the exposed or unexposed areas of the treated substrate by applying an agent which will react with the exposed or unexposed areas and inhibit the deposition of the metal. It is in particular preferred that such an agent neither forms bonds towards the ligand nor towards the metal. Examples of this agent include fluorinated silane compounds such as 1H,1H,2H,2H-Perfluorodecyldimethylchlorosilane and (Pentafluorophenyl)dimethylchlorosilane (PFPDCS).

In addition, the kind of substrate is not limited to a specific one. In particular, an inorganic oxide substrate such as made of $SiO_2$, quartz, $Al_2O_3$, $GeO_2$, $TiO_2$, $SnO_2$, ITO etc. may be used. Moreover, insulator materials such as glass, plastics including teflon, ceramics as well as SiC and diamond etc. can be used. In addition, semiconductor substrates such as made of Si, Ge, GaAs etc. may be used. Furthermore, metal substrates, particularly noble metals such as gold etc., may be used. The substrate as mentioned above may as well comprise any kind of laminated substrate, wherein the surface layer includes any substrate material as mentioned above.

According to the present invention, a substrate having a treated surface which is prepared by the method as explained above can be used for the manufacture of semiconductor devices or printed circuits having conductive pathways. Likewise, an at least partially metallized substrate which is prepared by the method as explained above can be used for the manufacture of semiconductor devices or printed circuits having conductive pathways.

The following examples will illustrate the present invention.

EXAMPLE 1

A quartz substrate was cleaned in a mixture of $H_2SO_4$/$Na_2S_2O_8$ and rinsed with distilled water until the resistivity of the rinsing water had a resistivity over $7\cdot10^6$ $\Omega$cm. The substrate was dried with isopropylalcohol and retained under argon until usage. This treatment is very efficient for enhancing the surface concentration of —SiOH.

Gasphase silylation

The gasphase reactor used in the examples consists of a glass tube which can be heated up to approximately 300° C. by means of heating belts. The tube has valves with PTFE (teflon) seals for the supply of argon and the silylating agent and for the connection to the vacuum pump via a cool trap. A conical flange with a PTFE seal and an inner diameter of 60 mm allows for supply and retrieval of the samples. The silylating agent is stored in a small flask which is connected to a valve and which can be heated in order to achieve sufficient vapor pressure of the silylating agent in the system.

The following steps were performed for sample preparation: At first, dehydration of the surface at 200° C. for 3 hours was performed in order to remove adsorbed water.

When monofunctional silanes are used, this step is not too critical. Even if the first monolayer of strongly adsorbed water molecules was not removed completely under these conditions, reaction with a silane molecule with adsorbed water molecules cannot result in deposition of crosslinked siloxane network as is the case when polyfunctional silanes are used. Rather, molecules that reacted with adsorbed water cannot bind to the surface and will desorb at low pressure and elevated temperature in the desorption step.

Silylation was performed at substrate temperatures between 100° C. and 200° C. for 1 to 2 hours with DMCSE, BPTCS, TVCS and, as a comparative example, p-tolyldimethlychlorosilane (TDMCS, pyrex). The whole system can be heated in order to achieve sufficient vapor pressure of the silylating agent and to allow for the reaction with the surface hydroxyl groups to occur. Subsequently, the input valve for the silylating agent was closed and the tube was evacuated for 3 to 6 hours at 100 to 200° C. to effect desorption of merely physisorbed silylating agent molecules.

The silylation procedure resulted in the formation of thin films and preferably monolayers of silane molecules having preferably a film thickness of about 1 nm. The silane molecules were covalently bonded to the oxide surface via siloxane bonds as was confirmed by UV-Vis spectroscopy on quartz slides and imaging ellipsometry on silicon/silica samples. Repeated rinsing in organic solvents resulted in the removal of only a small amount (5 to 20%) of silylating agent during the first rinsing step only. No further decrease of UV-absorption was observed after further rinsing steps. The degree of loss clearly depends on the duration of the desorption step in the reactor thus providing further proof for the covalent attachment of the first monolayer.

On these derivatized and optionally exposed substrate surfaces, Cu CVD was performed according to the following method: The chemical vapor deposition of Cu was conducted in a warm-walled bell jar reactor. The samples with surfaces functionalized by gasphase-silylation were introduced into the reactor and placed on a heatable plate. CVD was performed using (VTMS)Cu(hfac) (Cupra-select from Schumacher, commercially available) and (DMCOD)Cu (hfac), which was synthesized according to an improved synthesis disclosed in the U.S. Pat. Nos. 5 096 737, 1992, and 5 220 300, 1993. The CVD reaction conditions were as follows: The source temperature was 68° C. in the case of (DMCOD)Cu(hfac) and 45° C. in the case of (VTMS)Cu (hfac), the sample temperature was 220° C. in the case of (DMCOD)Cu(hfac) and 200° C. in the case of (VTMS)Cu (hfac). The total pressure was held at 750 Pa (7.5 mbar) for the duration of the experiment of 20 to 30 minutes.

Table 1 shows the results which were obtained when Cu CVD was performed on pyrex and quartz substrate surfaces which had been subjected to a surface treatment with DMCSE, BPTCS, TVCS and to no surface treatment, respectively. As a comparative example, p-tolyldimethlychlorosilane (TDMCS, pyrex) was used as a silylating agent. As expected, poor deposition or no deposition at all occured on bare $SiO_2$ surfaces as well as on slides treated with TDMCS (pyrex). When the surface treatment was performed with DMCSE, BPTCS or TVCS, a rapid growth of a Cu CVD film was observed. The surprisingly short nucleation time was followed by a steady growth of the copper film. Its growth rate was comparable to what was found on other metallic substrates (typically 50 nm/min was obtained with this set-up on gold film substrates when (DMCOD)Cu(hfac) was used as a precursor). A scotch test was performed on these last two samples. The scotch removed almost completely the copper film in the case of DMCSE or TVCS treated slides.

However, in the case of BPTCS treated surfaces, the film adhesion was clearly improved because only a small part of the copper film was removed.

TABLE 1

| Samples | Surface treatment | Cu CVD growth rate (nm/min) (DMCOD)Cu(hfac)/ Cupraselect | Scotch test |
|---|---|---|---|
| pyrex slides | no | — | |
| | DMCSE | 50/100 | − |
| | TDMCS | — | |
| | BPTCS | 50 to 80/100 to 120 | + |
| | TVCS | 80/100 | − |
| quartz slides | no | — | |
| | BPTCS | 50 to 80/100 to 120 | + |

Figure 2:
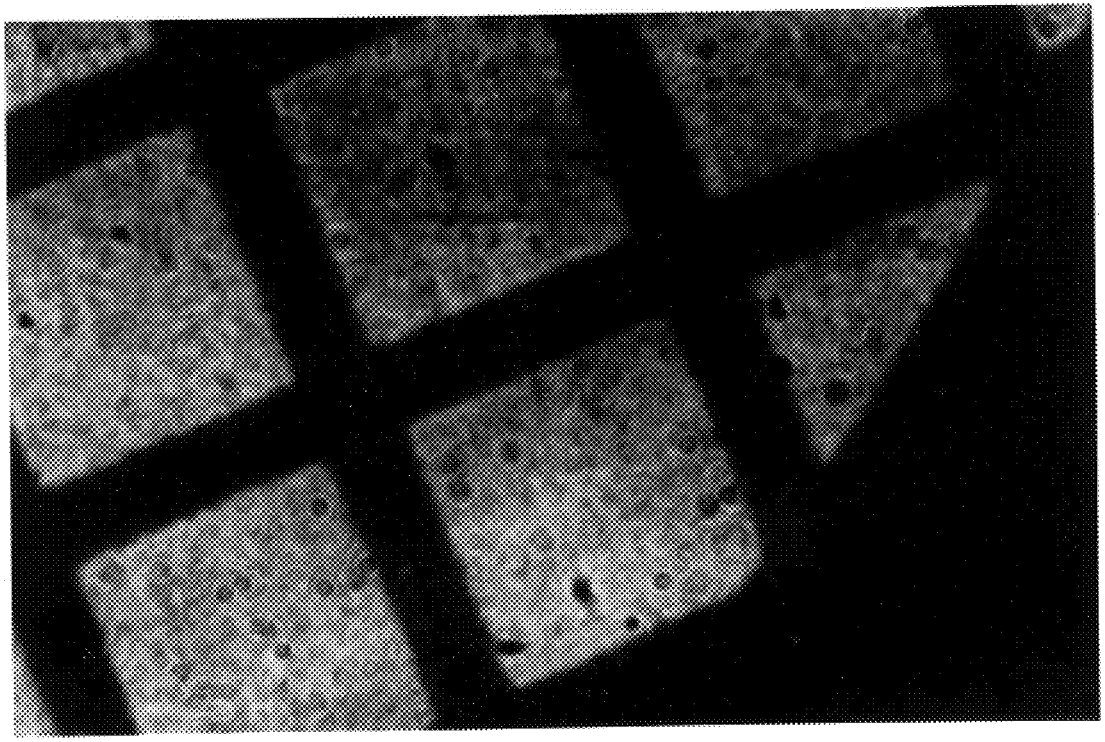
FIG. 2 shows the results obtained in the second example of the present invention.
Figure 3:
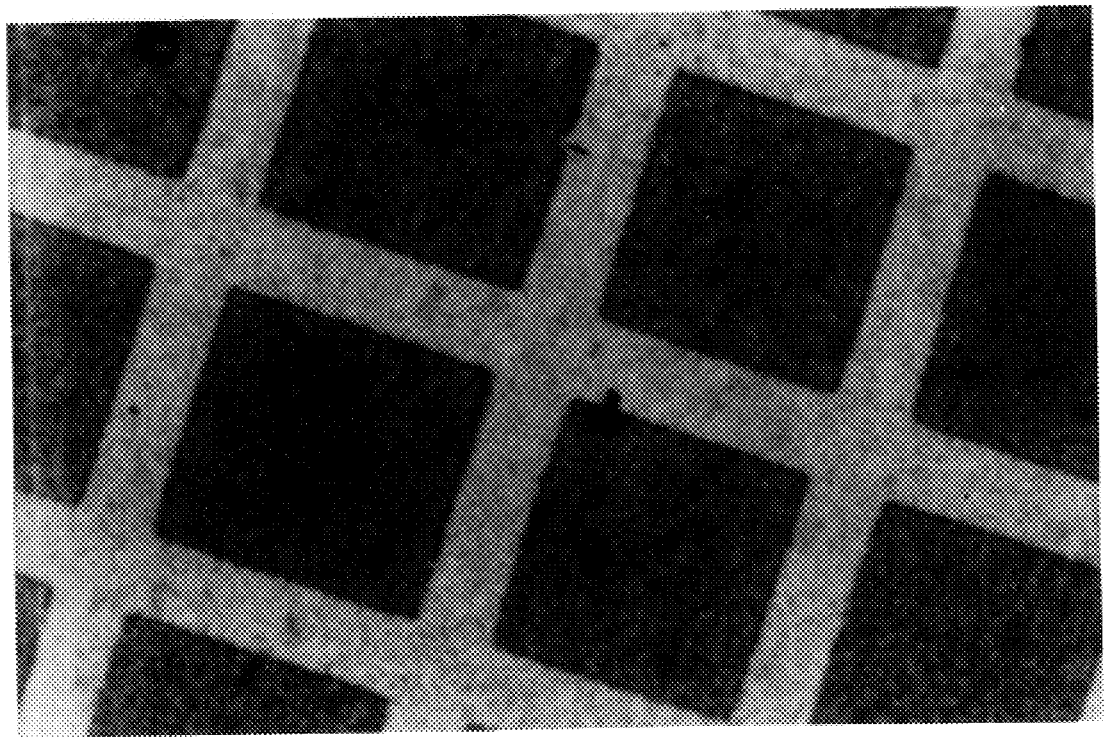
FIG. 3 shows the results obtained in the third example of the present invention.

The examples 2 and 3 will illustrate examples of patterning a negative and a positive image, respectively. FIGS. 2 and 3 show the optical microscope images of the products obtained in the examples 2 and 3. The copper pathways (dark portions) have a width of 10 μm and a thickness of 50 nm. On the bright portions, less than 10 nm copper are deposited.

EXAMPLE 2

Activated Metal Deposition After Exposure (Negative Image)

A silylation procedure as described above was conducted using DMCSE as a silylating agent. Subsequently, UV-illumination was performed with a high-pressure mercury lamp (Müller GmbH, Germany) or low pressure Hg lamp, type 6035 (Pen Ray, Oriel Corp. France), mainly emitting at 254 nm and around 190 nm, using a mask. A typical illumination duration was 30 min to 2 h.

Subsequently, copper CVD was performed as described above.

As can be seen from FIG. 2, copper is selectively deposited on the sample. Copper is deposited on the non-exposed areas while it is weakly or not deposited on the exposed areas (negative image).

EXAMPLE 3

Passivated Metal Deposition After Exposure (Positive Image)

A quartz substrate was treated in the same manner as described above with reference to example 1 using MPTES as a silylating agent.

UV-illumination was perfomed in the same manner using the same mask.

Chemical vapor deposition of Cu was performed, resulting in a pattern as shown in FIG. 3.

As can be seen from FIG. 3, copper is selectively deposited on the sample. Copper is deposited on the exposed areas while it is weakly or not deposited on the non-exposed areas (positive image).

As has been shown by these examples, the present invention provides an excellent method of treating a substrate surface so that in a subsequent metal deposition step a metallization pattern can be selectively applied without the presence of a catalyst.

The present invention relates to a method for treating a substrate surface. The substrate surface is coated with a thin film of a treating agent, which is capable of enhancing or reducing its affinity towards a metal precursor by exposure to an arbitrary kind of radiation beam. In a subsequent metal deposition step utilizing the metal precursor, the metal is selectively deposited on the exposed or unexposed areas, depending on the kind of treating agent. (FIG. 1)

What is claimed is:

1. A method for treating a substrate surface comprising the steps of:

providing a substrate; and applying a thin film comprising a treating agent, said treating agent reducing the affinity of the treating agent specifically towards a precursor of a metal to be deposited upon exposure to a radiation beam, in the absence of a catalyst.

2. A method according to claim 1, further comprising a step of exposing the treated substrate at least partially to a radiation beam.

3. A method according to claim 1, wherein the treating agent comprises at least one functional group enabling the treating agent in its non-irradiated form to react with the metal precursor.

4. A method according to claim 1, wherein said treating agent is represented by the general formula:

$$X-L-Y$$

wherein X is at least one functional group for bonding to the substrate, L is a linker group, and Y is at least one functional group enabling the treating agent in its non-irradiated form to react with the metal precursor.

5. A method according to claim 1, wherein said treating agent is represented by the general formula $$X_k R^1_n M (R^2 Y)_m,$$

wherein $R^1$ and $R^2$, respectively, represent a substituted or unsubstituted, branched or straight chain alkyl group, a substituted or unsubstituted aryl group or a substituted or unsubstituted aralkyl group, M represents Si, Ge or Sn, k denotes an integer number of 1 to 3, m denotes an integer number of 1 to 3 and n=4−m−k with n≧0.

6. A method according to claim 1, wherein said treating agent is applied by means of a CVD process.

7. A method for treating a substrate surface comprising the steps of:

providing a substrate;

applying a thin film comprising a treating agent, said treating agent reducing its affinity specifically towards a precursor of a metal to be deposited upon exposure to a radiation beam in the absence of a catalyst;

exposing the treated substrate at least partially to a radiation beam; and applying a second treating agent on the exposed areas having a reduced affinity specifically towards said metal precursor for further reducing the affinity in these regions.

8. A method for producing an at least partially metallized substrate, comprising the steps of:
providing a substrate;
applying a thin film comprising a treating agent, said treating agent reducing its affinity specifically towards a precursor of a metal to be deposited upon exposure to a radiation beam; and
depositing a metal, in the absence of a catalyst.

9. A method according to claim 8, wherein the metal deposition is conducted by using a metal precursor and/or disproportionating said metal precursor, and said metal precursor is a (β-diketonate)Me(I)L complex or Me(β-diketonate)$_n$, with n being an integer number of 1 to 4, wherein Me is the metal to be deposited, and L denotes a Lewis base.

10. A method according to claim 8, wherein the metal is deposited in a CVD process.

11. A method according to claim 8, wherein said metal is copper.

12. A method according to claim 8, wherein the metal deposition is conducted by using a metal precursor and/or disproportionating said metal precursor.

13. Use of a treated substrate prepared by the steps of providing a substrate, applying a thin film comprising a treating agent, said treating agent enhancing its affinity specifically towards a precursor of a metal to be deposited upon exposure to a radiation beam, and exposing the treated substrate at least partially to a radiation beam in the absence of a catalyst, for the manufacture of semiconductor devices or printed circuits having conductive pathways.

14. Use of an at least partially metallized substrate prepared by the steps of providing a substrate, applying a thin film comprising a treating agent, said treating agent enhancing its affinity specifically towards a precursor of a metal to be deposited upon exposure to a radiation beam, and exposing the treated substrate at least partially to a radiation beam, and depositing a metal, in the absence of a catalyst, for the manufacture of semiconductor devices or printed circuits having conductive pathways.

15. Use of a treated substrate prepared by the steps of providing a substrate, and applying a thin film comprising a treating agent, said treating agent reducing its affinity specifically towards a precursor of a metal to be deposited upon exposure to a radiation beam, in the absence of a catalyst, for the manufacture of semiconductor devices or printed circuits having conductive pathways.

16. Use of an at least partially metallized substrate prepared by the steps of providing a substrate, applying a thin film comprising a treating agent, said treating agent reducing its affinity specifically towards a precursor of a metal to be deposited upon exposure to a radiation beam, and depositing a metal, in the absence of a catalyst, for the manufacture of semiconductor devices or printed circuits having conductive pathways.

17. A method for treating a substrate surface comprising the steps of:
providing a substrate; and
applying a thin film comprising a treating agent, said treating agent enhancing its affinity specifically towards a precursor of a metal to be deposited upon exposure to a radiation beam, in the absence of a catalyst.

18. A method according to claim 17, further comprising the step of exposing the treated substrate at least partially to a radiation beam.

19. A method according to claim 17, wherein the treating agent comprises at least one functional group enabling the treating agent in its irradiated form to react with the metal precursor.

20. A method according to claim 17, wherein the treating agent is represented by the general formula:

$$X-L-Y$$

wherein X is at least one functional group for bonding to the substrate, L is a linker group, and Y is at least one functional group enabling the treating agent in its irradiated form to react with the metal precursor.

21. A method according to claim 17, wherein said treating agent is represented by the general formula $$X_k R^1_n M(R^2 Y)_m,$$

wherein $R^1$ and $R^2$, respectively, represent a substituted or unsubstituted, branched or straight chain alkyl group, a substituted or unsubstituted aryl group or a substituted or unsubstituted aralkyl group, M represents Si, Ge or Sn, k denotes an integer number of 1 to 3, m denotes an integer number of 1 to 3 and n=4−m−k with n≧0.

22. A method according to claim 17, wherein said treating agent is applied by means of a CVD process.

23. A method for treating a substrate surface comprising the steps of:
providing a substrate;
applying a thin film comprising a treating agent, said treating agent enhancing its affinity specifically towards a precursor of a metal to be deposited upon exposure to a radiation beam;
exposing the treated substrate at least partially to a radiation beam; and
applying a second treating agent on the unexposed areas having a reduced affinity specifically towards said metal precursor for further reducing the affinity in these regions, in the absence of a catalyst.

24. A method for producing an at least partially metallized substrate, comprising the steps of:
providing a substrate;
applying a thin film comprising a treating agent, said treating agent enhancing its affinity specifically towards a precursor of a metal to be deposited upon exposure to a radiation beam;
exposing the treated substrate at least partially to a radiation beam; and
depositing a metal, in the absence of a catalyst.

25. A method according to claim 24, wherein the metal deposition is conducted by using a metal precursor and/or disproportionating said metal precursor, and said metal precursor is a (β-diketonate)Me(I)L complex or Me(β-diketonate)$_n$, with n being an integer number of 1 to 4, wherein Me is the metal to be deposited, and L denotes a Lewis base.

26. A method according to claim 24, wherein the metal is deposited in a CVD process.

27. A method according to claim 24, wherein said metal is copper.

28. A method according to claim 24, wherein the metal deposition is conducted by using a metal precursor and/or disproportionating said metal precursor.

* * * * *